(12) United States Patent
Chien

(10) Patent No.: US 7,479,452 B2
(45) Date of Patent: Jan. 20, 2009

(54) METHOD OF FORMING CONTACT PLUGS

(75) Inventor: Jung-Wu Chien, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 327 days.

(21) Appl. No.: 11/104,213

(22) Filed: Apr. 12, 2005

(65) Prior Publication Data
US 2006/0228852 A1  Oct. 12, 2006

(51) Int. Cl.
H01L 21/44 (2006.01)

(52) U.S. Cl. .................. 438/672; 438/200; 438/210; 438/239; 438/675; 257/E21.649; 257/E27.084; 257/E21.646

(58) Field of Classification Search .......... 438/238, 438/239, 672, 675, 199, 200, 210; 257/E21.649, 257/E27.084, E21.646
See application file for complete search history.

(56) References Cited

U.S. PATENT DOCUMENTS

| | | | | |
|---|---|---|---|---|
| 6,008,084 A | * | 12/1999 | Sung | 438/241 |
| 6,476,488 B1 | * | 11/2002 | Jeng et al. | 257/751 |
| 6,483,136 B1 | * | 11/2002 | Yoshida et al. | 257/295 |
| 6,828,617 B2 | * | 12/2004 | Uh et al. | 257/306 |
| 2002/0031916 A1 | * | 3/2002 | Ohkubo et al. | 438/758 |
| 2002/0060351 A1 | * | 5/2002 | Shin et al. | 257/536 |
| 2002/0135004 A1 | * | 9/2002 | Uh et al. | 257/296 |

FOREIGN PATENT DOCUMENTS

| | | | |
|---|---|---|---|
| JP | 7-169755 | | 4/1995 |
| KR | 2001081154 A | * | 8/2001 |

* cited by examiner

*Primary Examiner*—Michelle Estrada
(74) *Attorney, Agent, or Firm*—Muncy, Geissler, Olds & Lowe, PLLC

(57) ABSTRACT

A method of forming cell bitline contact plugs is disclosed in the present invention. After providing a semiconductor substrate with a first region and a second region, cell bitline contacts are formed at the first region. After forming bitline pattern openings at the second region, poly spacers are formed on sidewalls of the cell bitline contacts and the bitline pattern openings. A substrate contact and a gate contact are then formed within the openings at the second region. After forming a trench around each of the substrate contact and the gate contact by performing an etching process, cell-bitline contact plugs, a substrate contact plug, and a gate contact plug are formed.

7 Claims, 9 Drawing Sheets

METHOD OF FORMING CONTACT PLUGS

BACKGROUND OF THE INVENTION

1. Field of the Invention

The present invention relates to semiconductor process integration and, more particularly, to a method of forming a bitline contact plug with a higher part and a lower part.

2. Description of the Related Art

Continued shrink of the dimensions of integrated circuits places more imperative requirements on creating contact openings, which are applied to form contact plugs to the integrated circuits. Particularly, the dynamic random access memory (DRAM) devices require certain integration practice to achieve the fabrication of the contact plugs, especially the bitline contact plugs, of which purpose to connect CMOS devices and memory cells.

For the concern of junction leakage, some of traditional bitline contact plugs of memory cells were made of N-doped polysilicon. The polysilicon plugs would form a continuously-distributed N-type junction, which would cause relatively lower junction leakage. However, concerning the DRAMS devices with a design rule of less than 140 nm, especially in the cases of deep sub-micron DRAM devices, a material with lower electrical resistivity is needed for the cell contact plugs. In other word, N-doped polysilicon may not be a good choice for forming the bitline contact plugs at the cell region.

However, the traditional metal plugs, such as tungsten plugs, are also not a good option for forming the bitline contact plugs at the cell region. That's because the junction leakage between the metal material and the semiconductor substrate is much larger than the junction leakage in the case of polysilicon contact plugs.

Furthermore, it is also an issue in the integration process of fabricating a contact plugs to create an opening with a dimension smaller than the minimum width of the design rule. The Japanese patent with number JP07-169755 illustrated an example to achieve this goal.

SUMMARY OF THE INVENTION

A method of forming cell bitline contact plugs is disclosed in the present invention. After providing a semiconductor substrate with a first region and a second region, cell bitline contacts are formed at the first region. After forming bitline pattern openings at the second region, poly spacers are formed on sidewalls of the cell bitline contacts and the bitline pattern openings. A substrate contact and a gate contact are then formed at the second region within the openings. After forming a trench around each of the substrate contact and the gate contact by performing an etching process, cell-bitline contact plugs, a substrate contact plug, and a gate contact plug are formed by depositing a metal layer and planarizing the metal layer.

According to one embodiment of the present invention, the first region of the semiconductor substrate is a cell area with an array of DRAM cells, and the second region is an area with peripheral circuits.

According to one embodiment of the present invention, the cell bitline contacts are formed by a photolithographic process and a self-aligned etching process.

According to one embodiment of the present invention, the substrate contact and the gate contact are formed by an etching process.

A structure of a contact plug is also disclosed in the present invention. The contact plug contains two parts. The first part is made of doped polysilicon, and is connected to the semiconductor substrate. The second part disposed on the first part is made of a metal material, such as tungsten or the like.

According to one embodiment of the present invention, a spacer is disposed adjacent to the second part.

According to one embodiment of the present invention, a barrier layer is disposed between the first part and the second part.

The invention is not limited to the features and advantages described above. Other embodiments and variations are within the scope of the invention, is defined by the appended claims.

BRIEF DESCRIPTION OF THE DRAWINGS

The objects and advantages of the present invention will be apparent from the following detailed description of the preferred embodiments of the invention with references to the following drawings.

DETAILED DESCRIPTION OF THE EMBODIMENT(S)

Figure 1:
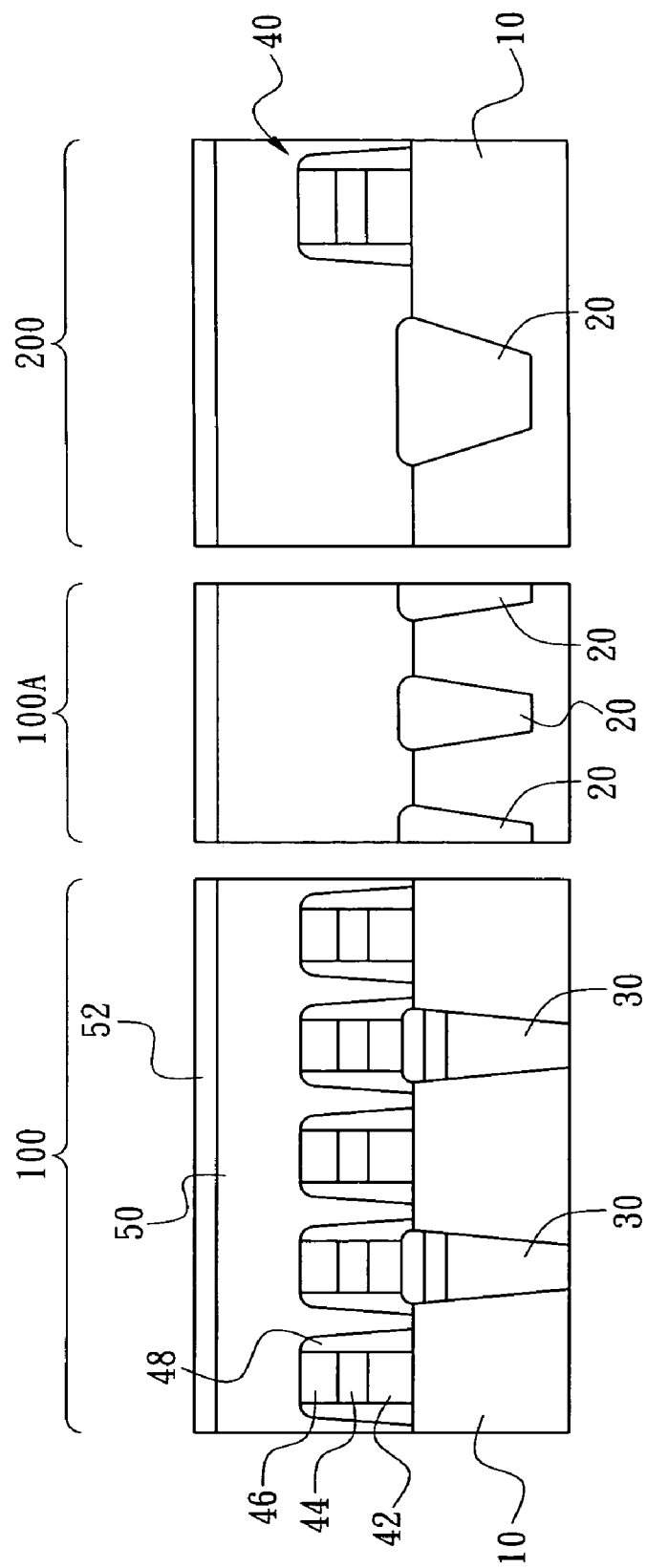
FIG. 1 illustrates the cross section of a semiconductor substrate with plenty of MOS transistors.

Referring first to FIG. 1, a semiconductor substrate 10 with plenty of MOS transistors is shown. According to one embodiment of the present invention, the semiconductor substrate 10 is divided into two regions, i.e. the first region 100 and the second region 200. According to one embodiment of the present invention, the first region 100 is a cell area with an array of DRAM cells, and the second region 200 is a peripheral area with peripheral circuits. The area 100A shown in FIGS. 1-8 is the cross-section of the bitline contact area of the cell area perpendicular to the cross-section of the first region 100.

There are many electrical isolation schemes 20, such as shallow trench isolations (STIs) or the like, formed in the semiconductor substrate 10. Each MOS transistor 40 has a source electrode (not shown in the figure), a drain electrode (not shown), and a gate electrode 40. Some of the MOS transistors 40 are connected to a capacitor 30 in the semiconductor substrate 10 to form a DRAM cell.

According to one embodiment of the present invention, the gate electrode 40 contains four layers, which are laterally covered by a spacer 48. The four layers constituting the gate electrode 40 are a gate oxide layer (not shown), a polysilicon layer 42, a silicide layer 44, and a nitride layer 46. The polysilicon layer 42 is formed by a chemical vapor deposition (CVD) process to a thickness of between 600 to 1000 Angstroms. The silicide layer 44 is made of tungsten, tungsten silicide or the like, having a thickness of between 650 to 1000 Angstroms. The nitride layer 46 composes of silicon nitride, silicon oxynitride or the like, with a thickness of between 1600 to 2200 Angstroms.

A first dielectric layer 50 is blanketly deposited on the MOS transistors 40 and the semiconductor substrate 10. The first dielectric layer 50 contains borophosphosilicate glass (BPSG), phosphosilicate glass (PSG), silicon oxide, borophosphotetraethoxysilane (BP-TEOS) or the like. The first dielectric layer 50 may include one or more layers, and its total thickness is between 8000 to 12000 Angstroms. A step of planarization process, such as chemical mechanical polishing (CMP), reflow, etching back, or the like, can be performed on the top of the first dielectric layer 50 to planarize the first dielectric layer 50.

After that, a hard mask layer 52 is deposited on the first dielectric layer 50 by a CVD process. The hard mask layer 52 contains polysilicon or the like.

Figure 2:
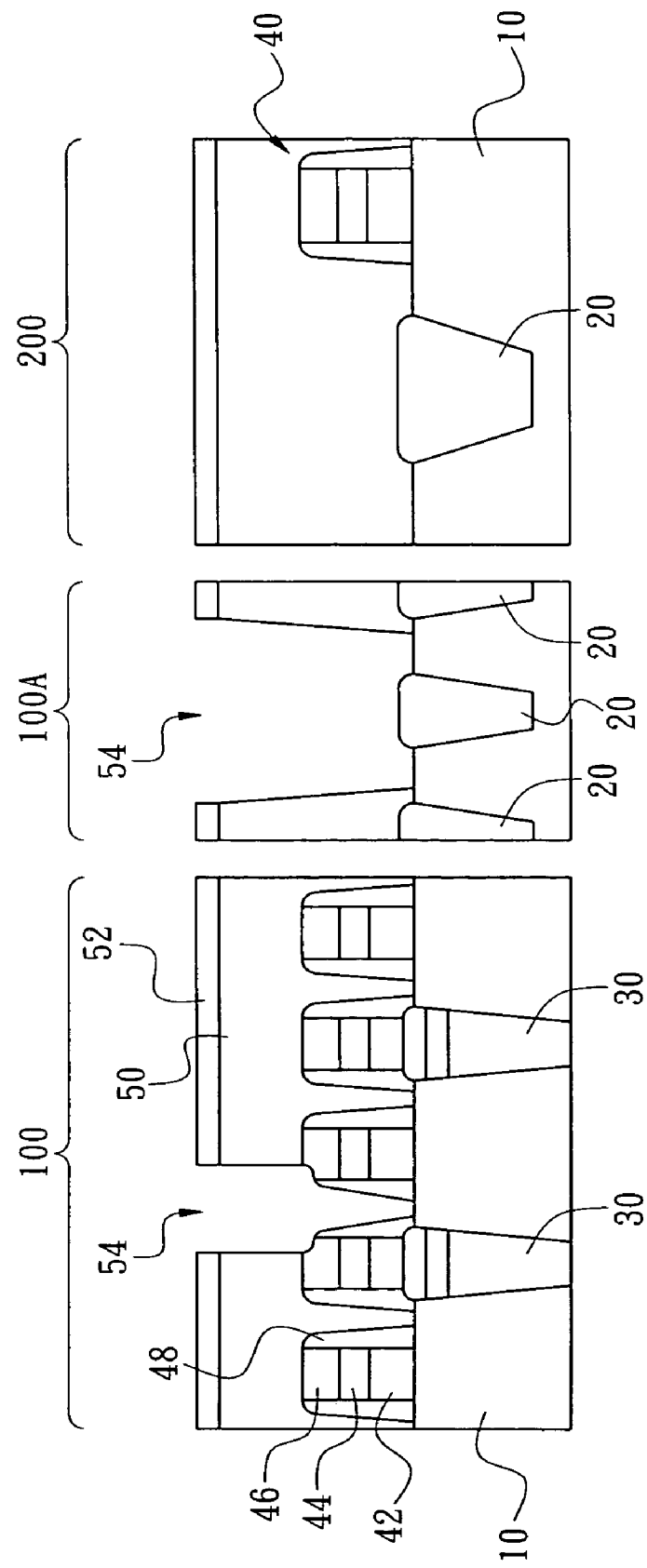
FIG. 2 illustrates the cross section of cell bitline contacts formed at the first region of the semiconductor substrate.

Referring now to FIG. 2, cell bitline contacts 54 are formed at the first region 100 of the semiconductor substrate 10. The cell bitline contacts 54 are formed by a photolithographic process and an etching process. According to one embodiment of the present invention, the etching process can be a self-aligned etching process. The etching process is performed selective to oxide with respect to silicon and nitride. Therefore, the etching process stops at the spacer 48, the nitride layer 46, and the semiconductor substrate 10, though a little part of the nitride layer 46 is etched during the etching process. According to one embodiment of the present invention, the etching gas can be $C_4F_8$, $C_5F_8$, $C_4F_6$ or the like, along with Ar and $O_2$.

Figure 2A:
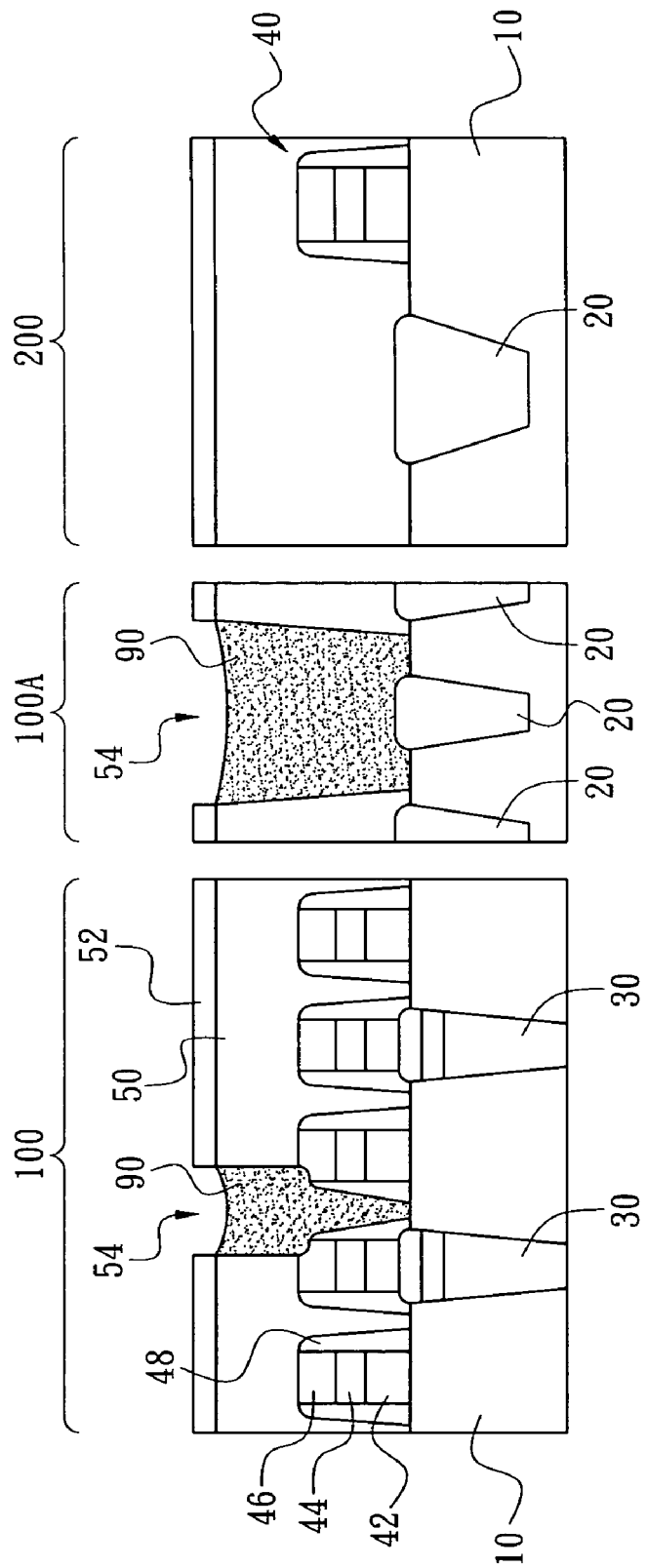
FIG. 2a illustrates the cross section of cell bitline contacts with BARC formed therein at the first region of the semiconductor substrate.
Figure 3:
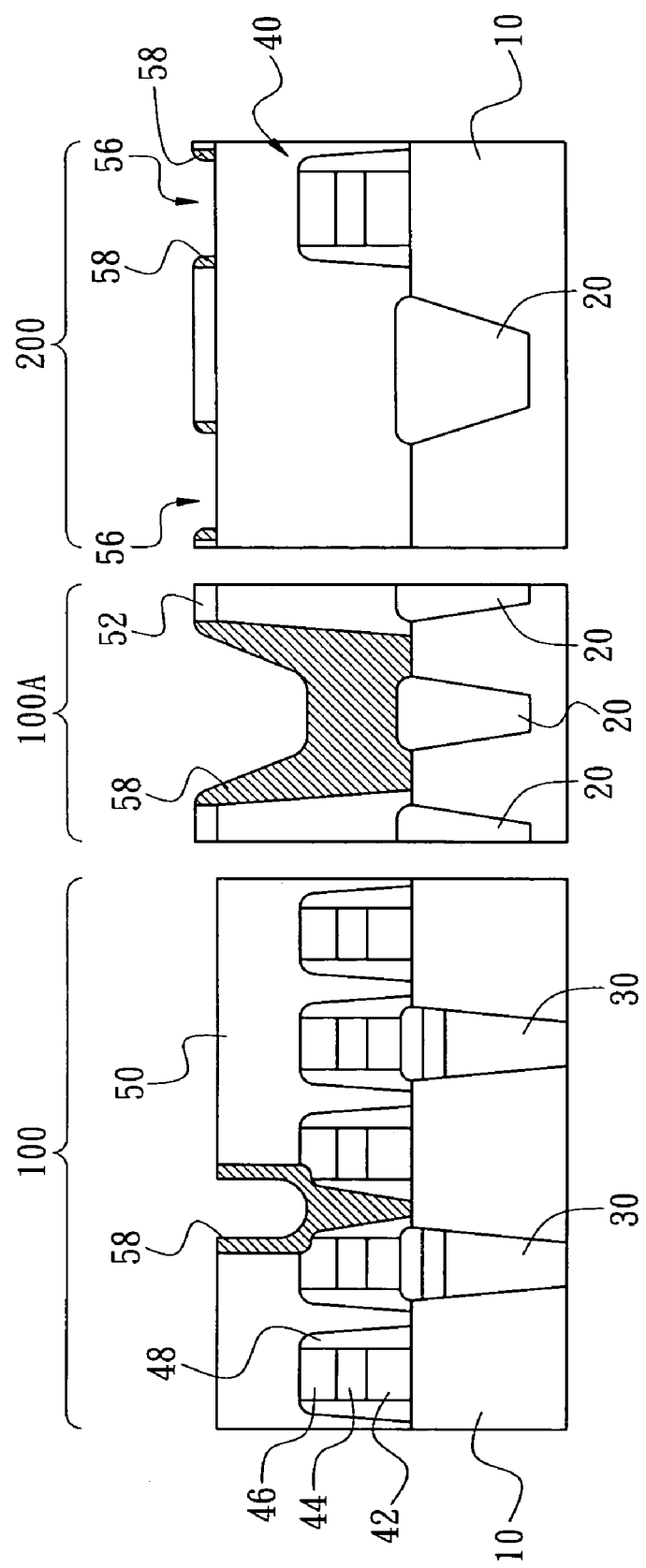
FIG. 3 illustrates the cross section of bitline patterns with poly spacers formed at the second region of the semiconductor substrate.

Bitline patterns cross through the first region 100 and the second region 200 of the substrate 10 are then formed. Referring now to FIGS. 2a and 3, bitline pattern openings 56 are formed at the second region 200 by a photolithographic process and an etching process. Preferably, a bottom anti-reflective coating (BARC) 90 is filled into the cell bitline contacts 54 to protect them from being etched when forming the bitline patterns, before a photoresist layer (not shown) for defining the bitline patterns is formed thereon. The etching process is performed selective to oxide and BARC 90 with respect to silicon and the hardmask 52. Partial hardmask 52 at the first region 100 is thus removed during the etching process. The photoresist layer and the BARC 90 are removed. Thereafter, poly spacers 58 are formed on the sidewalls of the cell bitline contacts 54 and the bitline pattern openings 56. In one embodiment of the invention, some material made for the poly spacers 58 is formed at the lower portion of the cell bitline contacts 54. The poly spacers 58 are formed by first depositing a layer of polysilicon to a thickness of between 300 to 800 Angstroms, and then performing an anisotropic etching or an etching back process. According to one embodiment of the present invention, the poly spacers 58 are formed with N+ dopants. The poly spacers 58 can further effectively reduce the line width of the bit lines.

Figure 4:
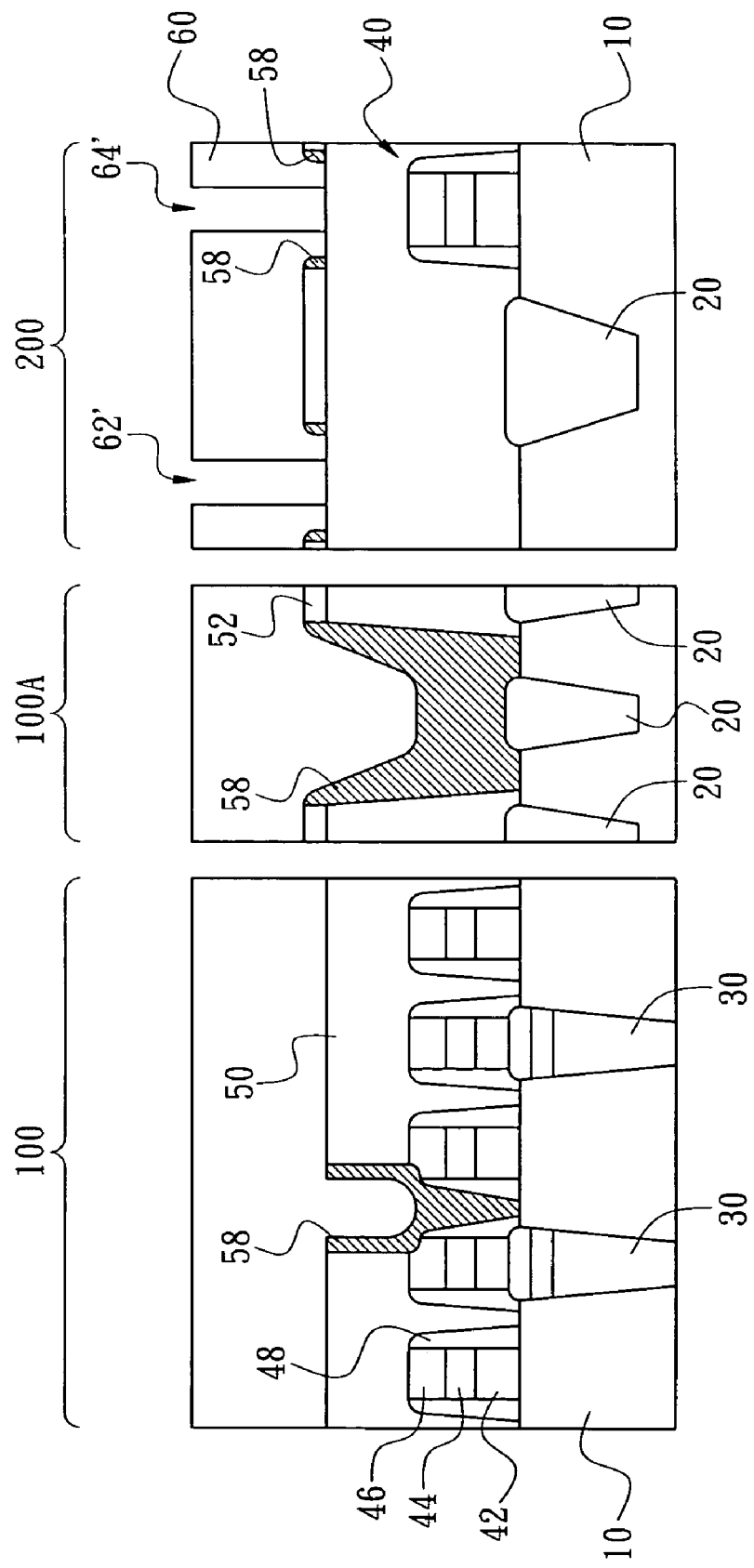
FIG. 4 illustrates the cross section of a photoresist layer defining CS and CG formed on the top of the semiconductor substrate.

Referring next to FIG. 4, a photoresist layer 60 is formed on the top of the semiconductor substrate 10. After that, the openings 62' and 64' for forming the substrate contact 62 and the gate contact 64, respectively, are created by performing a photolithographic process.

Figure 5:
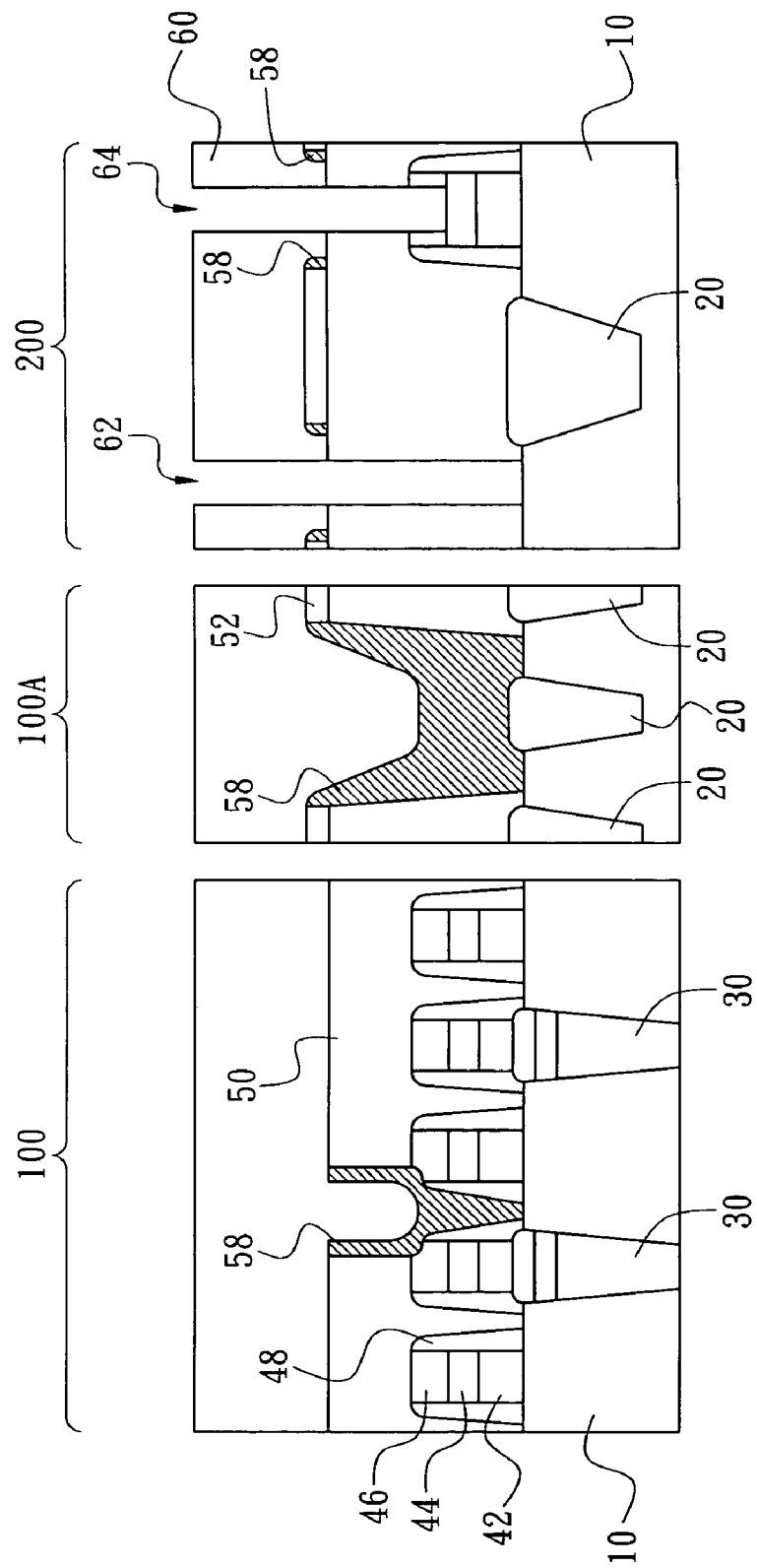
FIG. 5 illustrates the cross section of a substrate contact (CS) and a gate contact (CG) formed at the second region of the semiconductor substrate.

Referring then to FIG. 5, a substrate contact (CS) 62 and a gate contact (CG) 64 are formed at the second region 200 of the semiconductor substrate 10. The substrate contact 62 and the gate contact 64 are formed by an etching process. At the substrate contact 62, the etching process stops on the top of the semiconductor substrate 10. At the gate contact 64, the etching process stops on the top of the silicide layer 44. After that, the residual photoresist layer 60 is striped out.

Figure 6:
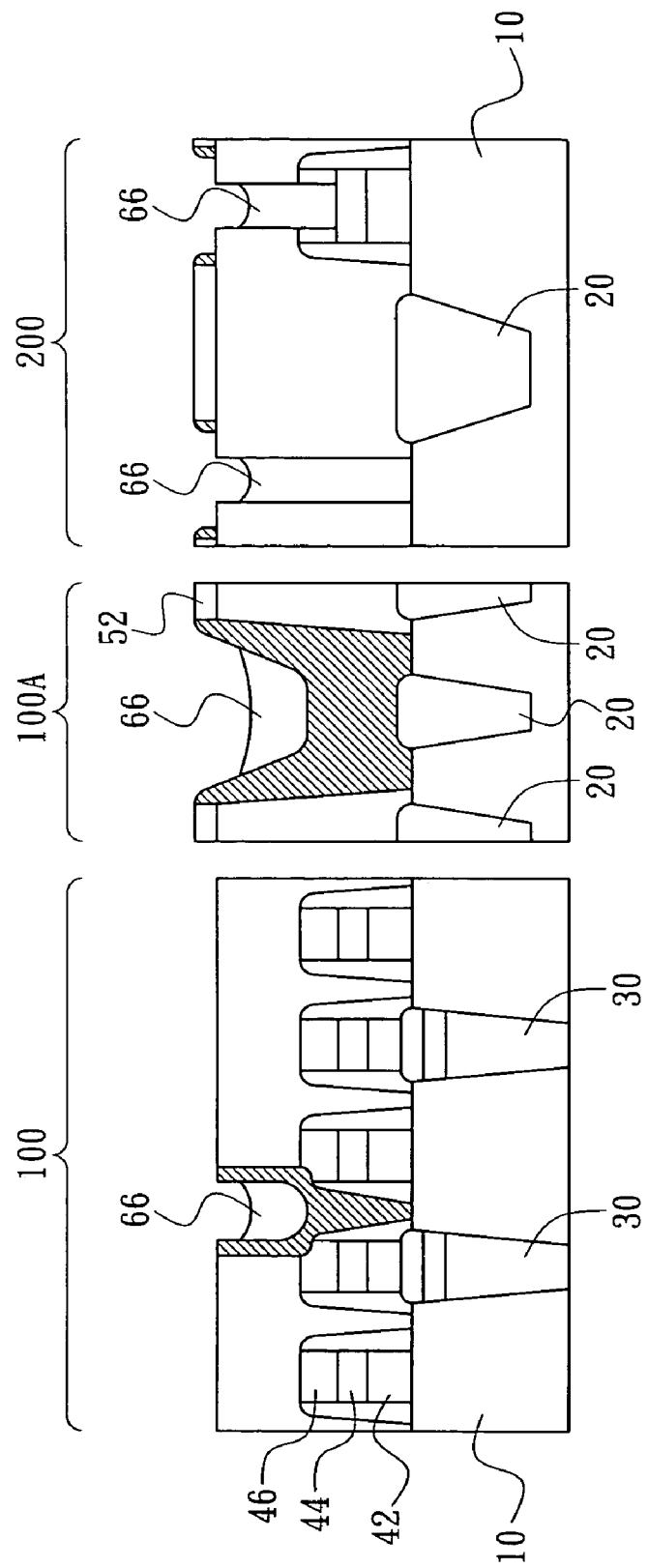
FIG. 6 illustrates the cross section of a BARC (Bottom Anti-Reflective Coating) layer formed in the cell bitline contacts, the substrate contact, and the gate contact.

Referring now to FIG. 6, a BARC (Bottom Anti-Reflective Coating) layer 66 is formed in the cell bitline contacts 54, the substrate contact 62, and the gate contact 64, in order to prevent the exposed substrate 10 and the gate 40 from damage during a subsequent bitline trench is formed. The BARC layer 66 is formed by first coating a layer of BARC and then performing a BARC recess etching process. In one embodiment of the present invention, the process steps of forming the BARC layer 66 are optional.

Figure 7:
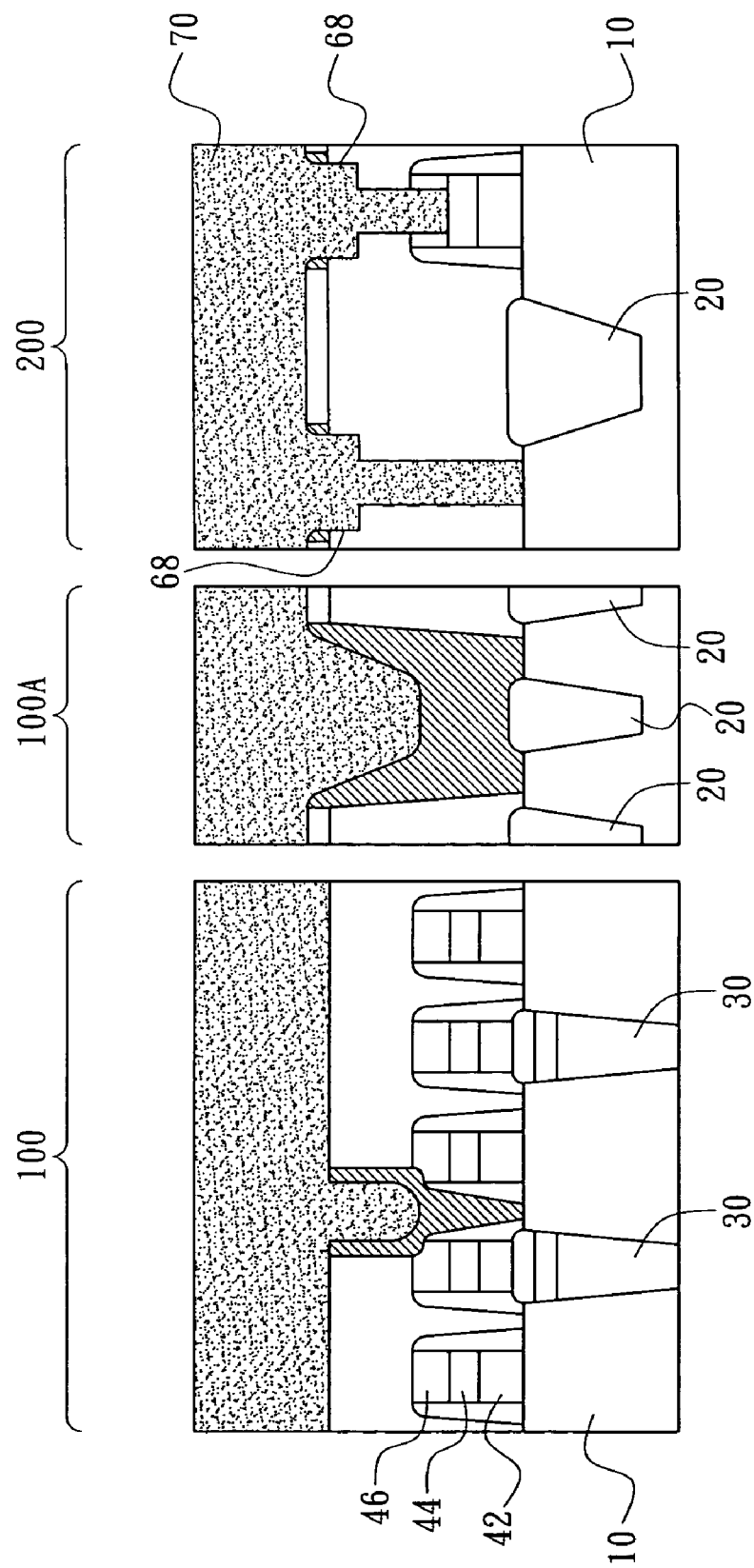
FIG. 7 illustrates the cross section of a tungsten layer formed on the top of the semiconductor substrate and in the cell bitline contacts, the substrate contact, and the gate contact.

Referring then to FIG. 7, a trench 68 is formed around each of the substrate contact 62 and the gate contact 64 by performing an etching process. Thereafter, a barrier layer (not shown in the figure) is deposited on the top of the semiconductor substrate 10 and in the cell bitline contacts 54, the substrate contact 62, and the gate contact 64. According to one embodiment of the present invention, the barrier layer contains of Ti/TiN or the like, which is deposited by an ionized physical vapor deposition (iPVD) process or a CVD process. In one embodiment of the present invention, the process step of forming the barrier layer is optional.

After that, a tungsten layer 70 is formed on the top of the semiconductor substrate 10 and in the cell bitline contacts 54, the substrate contact 62, and the gate contact 64. According to one embodiment of the present invention, the tungsten layer 70 can be replaced by other metal materials, such as copper (Cu), copper-aluminum alloy (Cu—Al), or the like.

Figure 8:
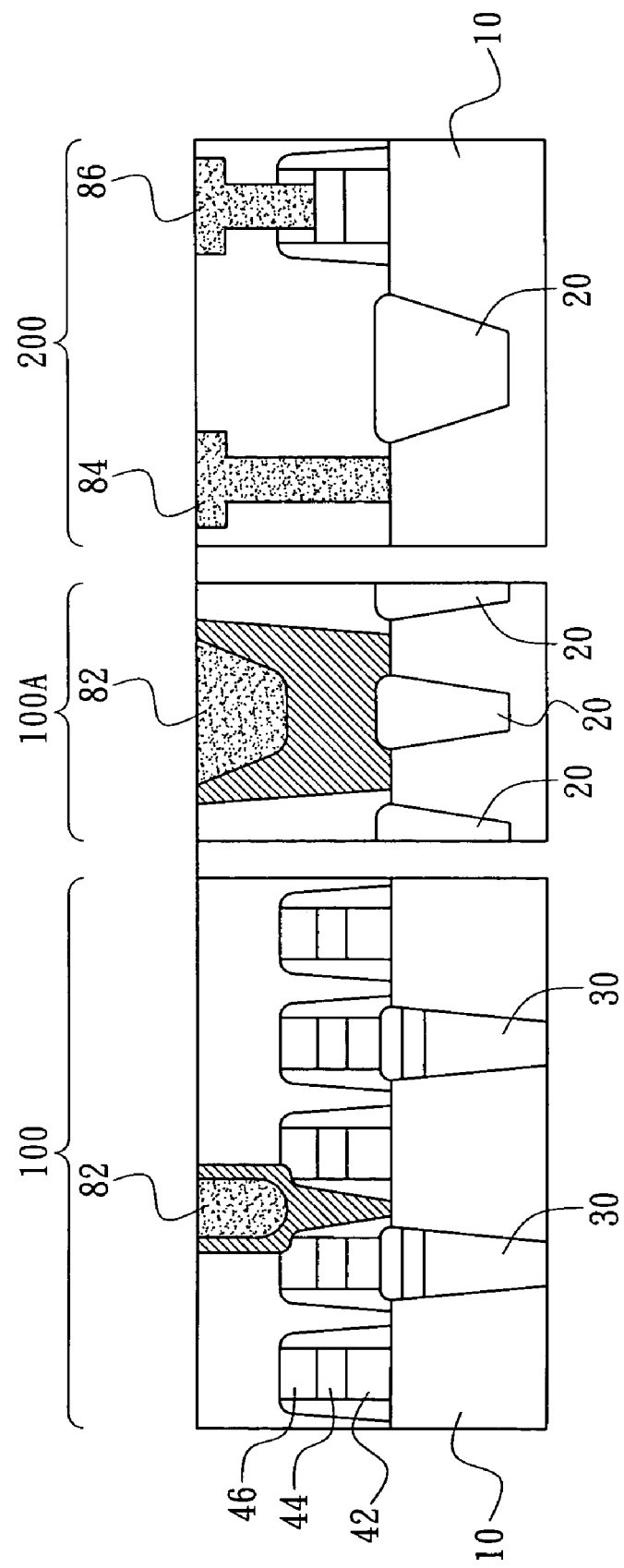
FIG. 8 illustrates the cross section of cell-bitline contact plugs, a substrate contact plug, and a gate contact plug.

Referring next to FIG. 8, cell-bitline contact plugs 82, a substrate contact plug 84, and a gate contact plug 86 are formed by planarizing, for example, performing a step of tungsten CMP process.

One of the features of the present invention is that the cell bitline contact plugs 82 include two parts. The first part of the cell bitline contact plugs 82, connected to the semiconductor substrate 10, is made of polysilicon. The second part of the cell bitline contact plugs 82 is made of metal, such as tungsten or the like. One advantage of this feature is that the first part, made of polysilicon, can be N-doped and diffused under high temperature so that the junction leakage can be much lower than the junction between metal and semiconductor substrate 10. Another advantage of this feature is that the second part, made of metal material, has larger electrical conductivity than a polysilicon plug. In other word, both advantages of the polysilicon plug and the metal plug are combined into the cell bitline contact plugs 82 in accordance with the present invention.

In addition, because the cell bitline contact plugs 82 are formed by two steps of manufacturing process, the traditional problem of causing voids in the plugs can be thus avoided.

Realizations in accordance with the present invention therefore have been described in the context of particular embodiments. These embodiments are meant to be illustrative and not limiting. Many variations, modifications, additions, and improvements are possible. For example, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method of forming contact plugs, comprising:
   forming a dielectric layer on a semiconductor substrate with a first region and a second region;
   forming a mask layer on the dielectric layer;
   forming at least one first contact in the mask layer and the dielectric layer at the first region;
   forming openings in the mask layer at the second region to expose the dielectric layer;
   forming polysilicon spacers on sidewalls of the openings and partially filling polysilicon in the first contact at the same time, wherein the polysilicon spacers are formed by first depositing a doped polysilicon layer and then etching back the doped silicon layer;
   patterning the dielectric layer exposed by the openings to form a second contact and a third contact within the openings;
   partially etching back the dielectric layer to form a trench around each of the second contact and the third contact by using the mask layer and the polysilicon spacers as an etching mask; and
   forming contact plugs in the first contact, the second contact, and the third contact.

2. The method of claim 1, wherein the first region has memory cells array thereon, and the second region has peripheral circuits thereon.

3. The method of claim 1, wherein the mask layer is a polysilicon layer.

4. The method of claim 1, wherein the first contact is formed by a photolithographic process and an etching process.

5. The method of claim 1, wherein the second contact and the third contact are formed by a photolithographic process and an etching process.

6. The method of claim 1, further comprising a step of forming a barrier layer in the first, the second and the third contacts between the step of forming the trenches and the step of forming the contact plugs.

7. The method of claim 1, wherein the contact plugs are formed by first depositing a metal layer and then planarizing the metal layer.

* * * * *